US 7,062,229 B2

(12) United States Patent
Dunworth et al.

(10) Patent No.: US 7,062,229 B2
(45) Date of Patent: Jun. 13, 2006

(54) DISCRETE AMPLITUDE CALIBRATION OF OSCILLATORS IN FREQUENCY SYNTHESIZERS

(75) Inventors: Jeremy D. Dunworth, Cardiff, CA (US); Brett C. Walker, San Diego, CA (US)

(73) Assignee: Qualcomm Incorporated

( * ) Notice: Subject to any disclaimer, the term of this patent is extended or adjusted under 35 U.S.C. 154(b) by 487 days.

(21) Appl. No.: 10/092,868

(22) Filed: Mar. 6, 2002

(65) Prior Publication Data

US 2003/0171106 A1 Sep. 11, 2003

(51) Int. Cl.
*H04B 1/40* (2006.01)

(52) U.S. Cl. ............................ 455/76; 455/75; 455/260

(58) Field of Classification Search ................. 455/75, 455/76, 85, 86, 87, 119, 196.1, 255, 258, 455/259, 260, 264, 318
See application file for complete search history.

(56) References Cited

U.S. PATENT DOCUMENTS

| | | | |
|---|---|---|---|
| 4,926,141 A | 5/1990 | Herold et al. | |
| 5,079,522 A | 1/1992 | Owen et al. | |
| 5,262,957 A | 11/1993 | Hearn | |
| 5,382,922 A | 1/1995 | Gersbach et al. | |
| 5,446,411 A | 8/1995 | Horsfall et al. | |
| 5,572,168 A | 11/1996 | Kasturia | |
| 5,625,325 A * | 4/1997 | Rotzoll et al. ................. | 331/16 |
| 5,701,598 A | 12/1997 | Atkinson | |
| 5,748,047 A | 5/1998 | Guthrie et al. | |
| 5,767,748 A | 6/1998 | Nakao | |
| 5,809,400 A | 9/1998 | Abramsky et al. | |
| 5,828,266 A | 10/1998 | Couet | |
| 5,870,001 A | 2/1999 | Osterling et al. | |
| 5,909,645 A | 6/1999 | Abramsky et al. | |
| 5,999,062 A | 12/1999 | Gilbert | |
| 6,008,703 A | 12/1999 | Perrott et al. | |
| 6,029,055 A | 2/2000 | Nobusawa | |
| 6,163,228 A * | 12/2000 | Pope ...................... | 331/117 R |

(Continued)

FOREIGN PATENT DOCUMENTS

JP 8102664 4/1996

(Continued)

OTHER PUBLICATIONS

Margarit, et al., "A Low-Noise, Low-Power VCO with Automatic Amplitude Control for Wireless Applications", IEEE Journal of Solid-State Circuits, vol. 34, No. 6, Jun. 1999, pp. 761-771.

(Continued)

*Primary Examiner*—Quochien B. Vuong
*Assistant Examiner*—Lewis West
(74) *Attorney, Agent, or Firm*—Philip R Wadsworth; Charles D. Brown; George C. Pappas

(57) ABSTRACT

In one embodiment, this disclosure describes a frequency synthesizer for use in a wireless communication device, or similar device that requires precision frequency synthesis but small amounts of noise. In particular, the frequency synthesizer may include a phase locked loop (PLL) and an integrated voltage controlled oscillator (VCO). The frequency synthesizer may implement one or more amplitude calibration techniques prior to enabling the PLL. For example, an amplitude calibration unit may be used to selectively activate switched unit current sources within a tail current source of the VCO. In this manner, the amplitude the signal generated by the oscillator can be adjusted without requiring closed-loop amplitude monitoring or control.

11 Claims, 9 Drawing Sheets

U.S. PATENT DOCUMENTS

| | | | |
|---|---|---|---|
| 6,167,245 | A | 12/2000 | Welland et al. |
| 6,172,579 | B1 | 1/2001 | Dacus et al. |
| 6,175,282 | B1 | 1/2001 | Yasuda |
| 6,211,747 | B1 | 4/2001 | Trichet et al. |
| 6,233,441 | B1 | 5/2001 | Welland et al. |
| 6,292,507 | B1 | 9/2001 | Hardin et al. |
| 6,369,647 | B1 | 4/2002 | Main et al. |
| 6,424,230 | B1 | 7/2002 | Kocaman et al. |
| 6,466,096 | B1 | 10/2002 | DeVito |
| 6,653,908 | B1 * | 11/2003 | Jones .................... 331/183 |
| 6,661,291 | B1 | 12/2003 | Jovenin |
| 6,680,655 | B1 * | 1/2004 | Rogers .................... 331/109 |
| 2001/0009391 | A1 | 7/2001 | Kawada et al. |
| 2002/0075080 | A1 * | 6/2002 | Nelson et al. ............ 331/11 |
| 2002/0163396 | A1 | 11/2002 | Lim et al. |
| 2003/0011437 | A1 | 1/2003 | Ozawa |
| 2003/0025566 | A1 | 2/2003 | Rogers |
| 2003/0119467 | A1 | 6/2003 | Welland et al. |
| 2003/0171104 | A1 | 9/2003 | Van Rumpt |
| 2003/0171105 | A1 * | 9/2003 | Dunworth et al. .......... 455/258 |
| 2003/0171106 | A1 | 9/2003 | Dun Worth et al. |
| 2003/0186666 | A1 | 10/2003 | Sindhushayana |

FOREIGN PATENT DOCUMENTS

| | | |
|---|---|---|
| JP | 2000049597 | 2/2000 |
| JP | 2001156633 | 6/2001 |

OTHER PUBLICATIONS

"A Space-Qualified Freqneyc Synthesizer" IEEE (1991).
"Design of an Integrated CMOS PLL Frequency Synthesizer" IEEE.

* cited by examiner

DISCRETE AMPLITUDE CALIBRATION OF OSCILLATORS IN FREQUENCY SYNTHESIZERS

FIELD

This disclosure relates frequency synthesizers that can be implemented within wireless communication devices, and more particularly to oscillators integrated within frequency synthesizers.

BACKGROUND

Frequency synthesizers are commonly implemented within wireless communication devices that transmit and receive encoded radio frequency (RF) signals. A number of different wireless communication techniques have been developed including frequency division multiple access (FDMA), time division multiple access (TDMA) and various spread spectrum techniques. One common spread spectrum technique used in wireless communication is code division multiple access (CDMA) signal modulation in which multiple communications are simultaneously transmitted over a spread spectrum radio-frequency (RF) signal. Some example wireless communication devices that have incorporated one or more wireless communication techniques include cellular radiotelephones, PCMCIA cards incorporated within portable computers, personal digital assistants (PDAs) equipped with wireless communication capabilities, and the like.

Frequency synthesizers of wireless communication devices may be used during both RF signal reception and RF signal transmission. For example, during RF signal reception of CDMA encoded signals, RF signals are typically mixed down to baseband signals, which can be converted to digital values. During the mixing down process, reference waveforms are produced by a frequency synthesizer that utilizes a local clock of the wireless communication device as a timing reference. After mixing the RF signal down to baseband, the baseband signals are typically passed through an analog-to-digital (A/D) converter to produce the digital values that can be tracked and demodulated. For example, a RAKE receiver can be used to track and demodulate multipath signals of a CDMA system. A number of different CDMA architectures have been developed, such as for example, a heterodyne architecture that includes both an intermediate frequency (IF) section and an RF section, and a Zero IF architecture which converts incoming RF signals directly into baseband signals without first converting the RF signals to IF signals. Depending on the architecture, any number of frequency synthesizers may be implemented to provide reference waveforms to the mixers.

Frequency synthesizers are also used during RF signal transmission. In that case, baseband signals are up-mixed to RF. During the up-mixing process, the frequency synthesizer produces carrier RF waveforms. The carrier waveforms are then encoded with the baseband signal before being transmitted. Again, the frequency synthesizer typically uses the local clock of the wireless communication device as the timing reference. For example, the carrier RF waveform may be created by a voltage controlled oscillator (VCO) whose frequency is determined by a phase locked loop (PLL). The timing reference for the PLL is a high precision low frequency crystal oscillator, such as a voltage controlled temperature compensated crystal oscillator (VCTCXO). The VCO may be off-chip, or alternatively integrated on-chip. The phase locked loop (PLL) that provides closed-loop analog control of the oscillator can either be integrated on the same chip as the VCO, or can likewise be a separate off-chip component.

Amplitude control of the oscillating signal of a VCO is a major concern. In particular, the amplitude of the oscillating signal needs to be large enough to ensure that the VCO has adequate phase noise performance. On the other hand, too much amplitude is undesirable because too much amplitude can push the VCO into an operating region where phase noise is degraded as the amplitude is increased. For these reasons, conventional implementations of frequency synthesizers typically provide continuous closed-loop control of the amplitude of the oscillating signal generated by the VCO.

SUMMARY

In one embodiment, a frequency synthesizer comprises an oscillator including a configurable tail current source, a phase locked loop that controls the frequency of the oscillator, and an amplitude calibration unit that calibrates the configurable tail current source in order to achieve a desired amplitude of the oscillating signal. For example, the configurable tail current source may include a set of switched unit current sources that can be selectively activated to configure the configurable tail current source. During calibration, the phase locked loop may be disabled, and the amplitude calibration unit may selectively activate a subset of the set of switched unit current sources. In this manner, discrete open-loop amplitude calibration of the frequency synthesizer can be achieved, and the need for continuous closed-loop amplitude control can be avoided.

The various embodiments and techniques described in detail below may be implemented in hardware, software, firmware, or any combination thereof. Additional details of these and other embodiments are set forth in the accompanying drawings and the description below. Other features, objects and advantages will become apparent from the description and drawings, and from the claims.

DETAILED DESCRIPTION

In general, this disclosure is directed to a frequency synthesizer for use in a wireless communication device. The frequency synthesizer includes an oscillator, such as a voltage controlled oscillator (VCO), and an amplitude control unit. The amplitude control unit may implement open-loop amplitude calibration of the oscillator in order to provide coarse amplitude control without the need for continuous closed-loop amplitude monitoring. In other words, discrete adjustments to a configurable tail current source of the oscillator can be made during amplitude calibration. The frequency synthesizer may also include a phase locked loop (PLL) to provide analog tuning control of the oscillator frequency. For example, the oscillator may be integrated with the PLL. During amplitude calibration, however, the PLL may be disabled so that the configurable tail current source of the oscillator can be adjusted.

Figure 1:
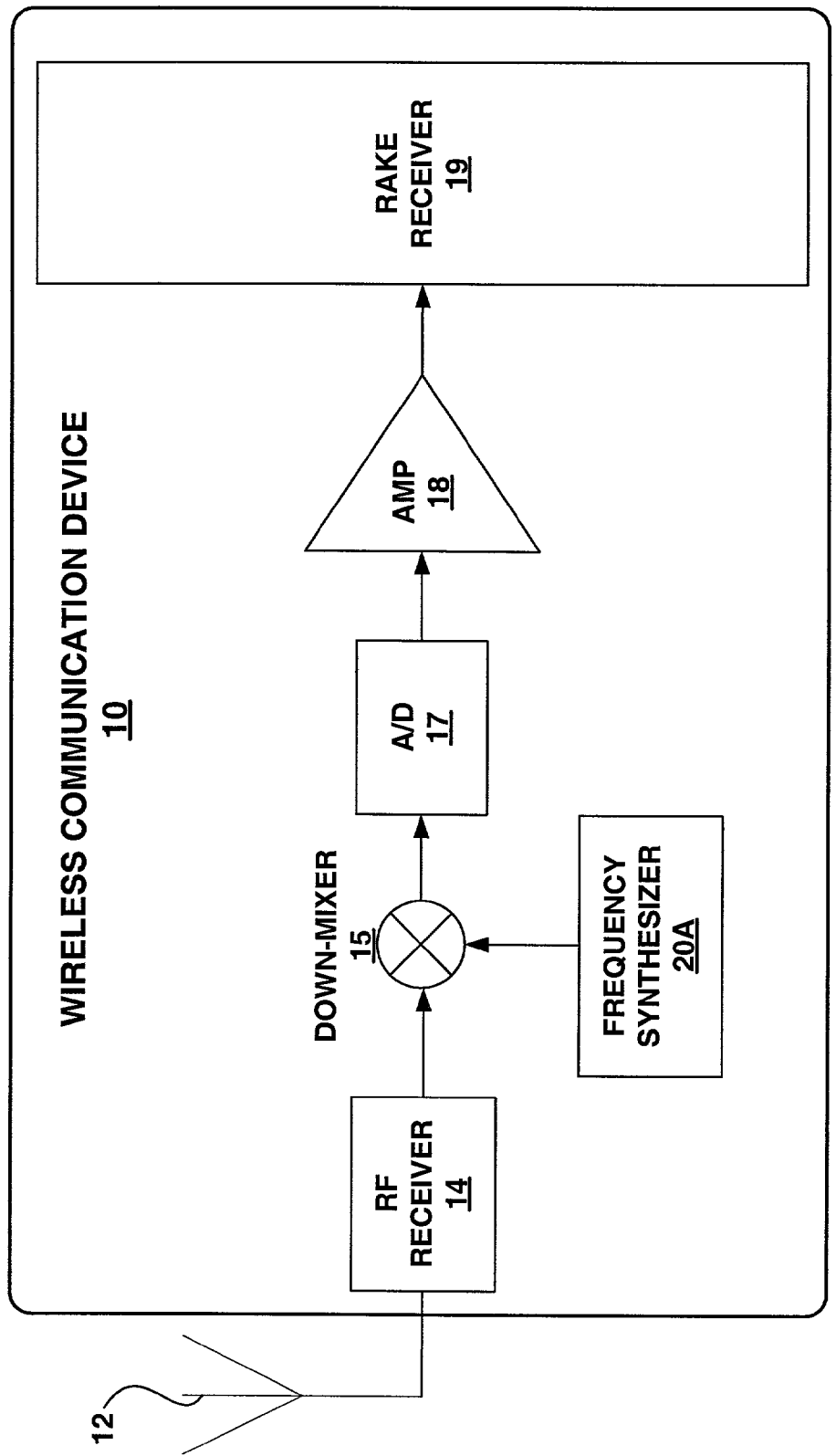
FIG. 1 is a block diagram of a wireless communication device implementing a frequency synthesizer for RF signal reception.
Figure 2:
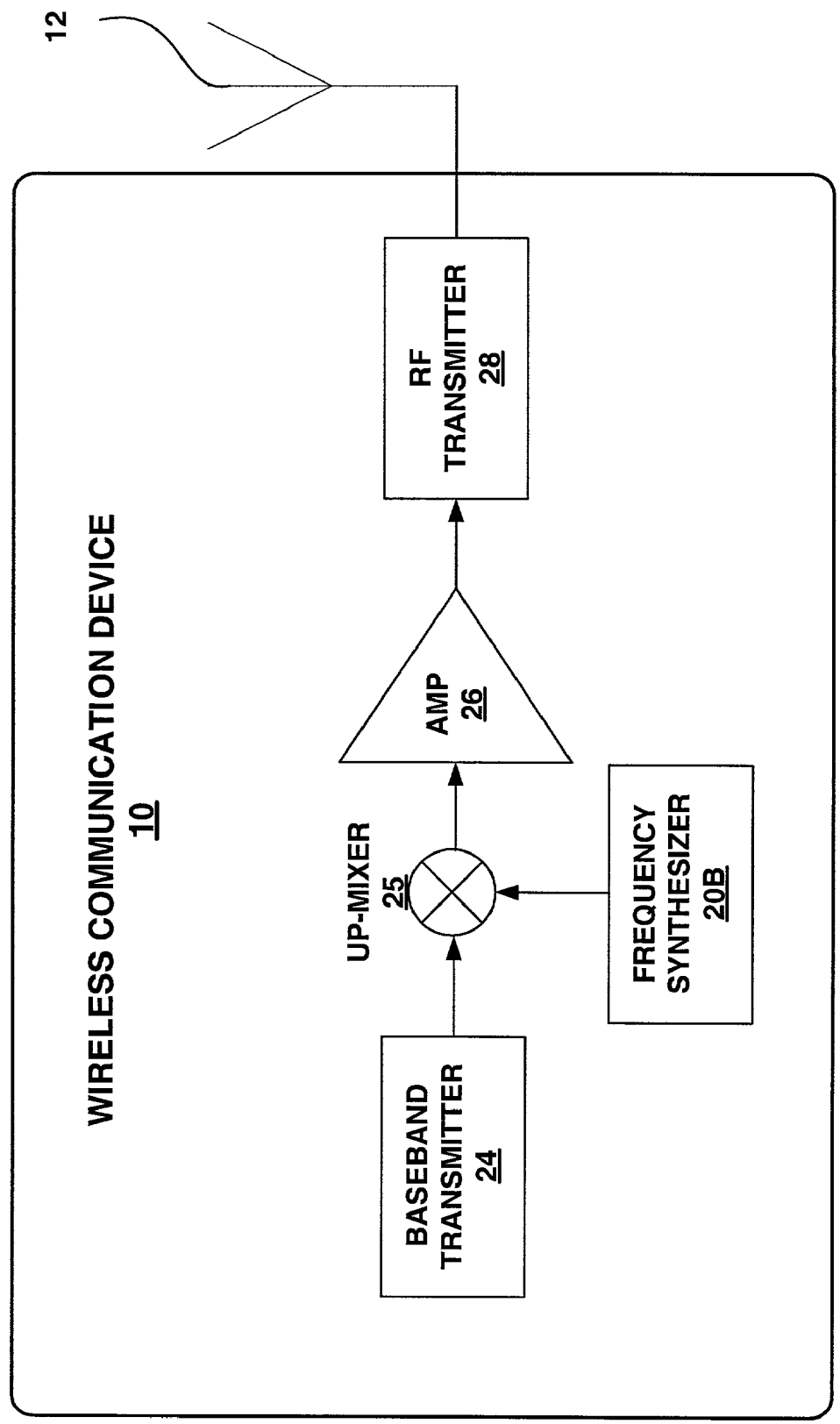
FIG. 2 is a block diagram of a wireless communication device implementing a frequency synthesizer for RF signal transmission.

FIGS. 1 and 2 are block diagrams of a wireless communication device 10 incorporating frequency synthesizers 20A and 20B, respectively. Frequency synthesizer 20A operates for RF signal reception, whereas frequency synthesizer 20B operates for RF signal transmission. Frequency synthesizers 20A, 20B may be substantially identical in structure and operation, and in some cases may be the same frequency synthesizer used for both RF signal transmission and reception. Frequency synthesizers 20A and 20B will be referred to herein as frequency synthesizer 20. Whether it is used in reception or transmission, frequency synthesizer 20 may implement one or more of the techniques outlined below to improve operation of the wireless communication device 10.

The block diagram of FIG. 1 illustrates an exemplary wireless communication device (WCD) 10 implementing the Zero IF architecture, although this disclosure is not limited in that respect. In a Zero IF architecture, WCD 10 converts incoming RF signals directly into baseband signals and, specifically, does not first convert the RF signals to IF signals. It is understood, however, that the techniques described herein may be readily applicable to any architecture that implements one or more frequency synthesizers.

WCD 10 includes antenna 12 that receives incoming RF signals. For example, the incoming RF signals may comprise code division multiple access (CDMA) modulated signals sent from a CDMA base station. An RF signal received by antenna 12 can be processed by RF receiver 14, such as by passing the signal through low-noise amplifier (LNA) and one or more filters. The RF signal is then mixed down to baseband by down-mixer 15. In particular, down-mixer 15 may receive reference waveforms produced by frequency synthesizer 20A. Frequency synthesizer 20A may implement one or more amplitude calibration techniques, as outlined in greater detail below, to calibrate the amplitude of oscillating signals of the frequency synthesizer to approximately the correct amplitude. The amplitude calibration routine may improve the synthesis process, reduce noise in the system, and allow for simplification of frequency synthesizer 20A by avoiding the need for continuous closed-loop amplitude control.

Down mixer 15 produces baseband signals which can be filtered and sampled by analog to digital (A/D) converter 17 to produce corresponding digital values of the signals. RAKE receiver 19 may receive the digital values to separate and track signals received from different sources, i.e., different base stations. As desired, WCD 10 may also include additional components such as filters and various other digital or analog signal processing components (not shown).

FIG. 2 is another block diagram of WCD 10, illustrating components implemented during RF signal transmission. In the example of FIG. 2, baseband transmitter 24 may generate and forward baseband signals to up-mixer 25. Frequency synthesizer 20B provides carrier RF waveforms to up-mixer 25. Again, frequency synthesizer 20B implements amplitude calibration techniques as outlined below to calibrate of the oscillating signals generated by the frequency synthesizer to approximately the correct amplitude. Frequency synthesizer 20B may be substantially identical to frequency synthesizer 20A (FIG. 1), or may have a slightly different structure or operation than that used for signal reception.

Up-mixer 25 modulates the baseband signal into the RF carrier and forwards the modulated RF signal to amplifiers 26 for scaling. Amplifiers 26 may include one or more voltage gain amplifiers (VGAs), driver amplifiers (DAs), and power amplifiers (PAs). The different amplifiers may reside on the same integrated circuit chip, or multiple different chips. Once the modulated RF signal has been adequately amplified or attenuated, RF transmitter 28 may transmit the modulated RF signal from wireless communication device 10 via antenna 12.

Figure 3:
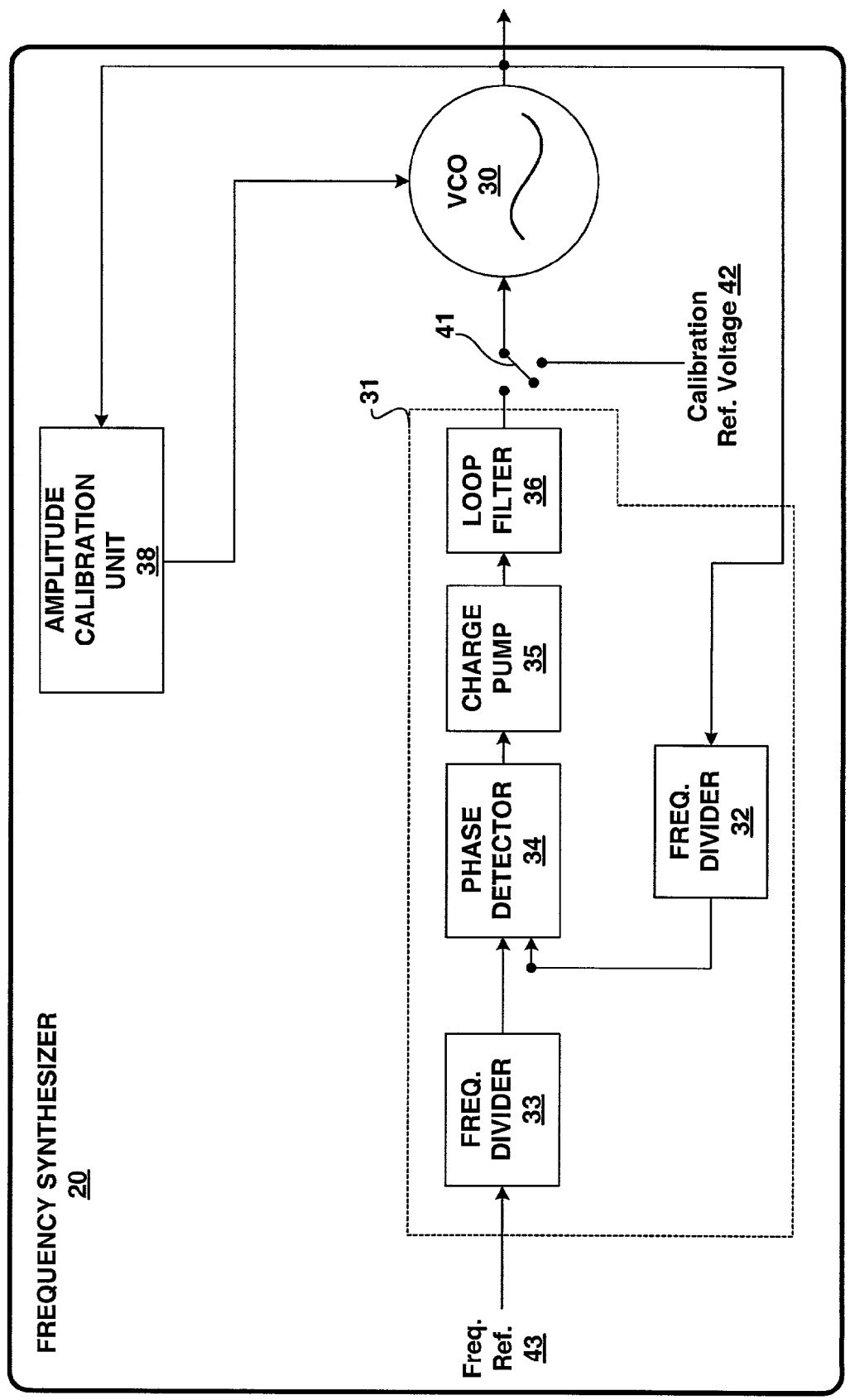
FIG. 3 is a more detailed block diagram of an exemplary frequency synthesizer as shown in FIGS. 1 and 2.

FIG. 3 is a more detailed block diagram of frequency synthesizer 20 according to an exemplary embodiment. Frequency synthesizer 20 may comprise an oscillator such as a voltage controlled oscillator (VCO) 30 that interacts with a phase locked loop (PLL) 31. For example, PLL 31 may provide analog closed-loop control of the frequency of VCO 30 by controlling an input control voltage that is applied to the VCO.

PLL 31 may include a number of components, including, for example, frequency dividers 32 and 33, a phase detector 34, a charge pump 35 and a loop filter 36. Frequency dividers 32 and 33 can respectively scale a reference frequency 43 (such as the frequency provided by a temperature compensated crystal oscillator (TCXO)), and the VCO frequency, so that phase detector 34 can determine the frequency difference between the two frequencies. Charge pump 35 can then adjust the input voltage to VCO 30 as needed, to either increase or decrease the oscillating frequency of VCO 30. Loop filter 36 may perform filtering of the input signals to VCO 30 in order to improve performance of frequency synthesizer 20 and possibly reduce noise in the system.

Frequency synthesizer 20 also includes an amplitude control unit 38. Amplitude control unit 38 can calibrate VCO 30 during a calibration routine prior to the activation of PLL 31 in order to ensure that the amplitude of the oscillating signal provided by VCO is acceptable. For example, amplitude control unit 38 may be coupled to configurable circuitry of a tail current source within VCO 30. In that case, amplitude control unit 38 can measure the amplitude of the voltage signals generated by VCO 30, and selectively activate switches of the configurable circuitry to adjust the amplitude. In this manner, discrete adjustments to the amplitude of the oscillating signal of the VCO 30 can be provided prior to the activation of PLL 31.

Amplitude control of the oscillating signal of VCO 30 is desirable for a number of reasons. In particular, the amplitude of the oscillating signal needs to be large enough to ensure that the VCO 30 has adequate phase noise performance. On the other hand, too much amplitude is undesirable because too much amplitude can push the VCO 30 into an operating region where phase noise is degraded as the amplitude is increased. Amplitude control is typically achieved by varying the bias, and thus power consumption of the VCO 30. Also, in addition to controlling the power consumption of the VCO 30 to optimize noise performance, the amplitude control loop may provide sufficient startup margin in the VCO 30 bias in order to ensure that VCO 30 is able to oscillate when it is enabled. Conventional implementations of frequency synthesizers typically provide continuous closed-loop control of the amplitude of the oscillating signal generated by the VCO. However, continuous closed-loop control of the amplitude also adds significant noise to the phase noise spectrum of the VCO.

For these and other reasons, frequency synthesizer 20 includes amplitude calibration unit 38 to provide open-loop discrete adjustments to the tail current source of VCO 30 in order to calibrate the amplitude of the oscillating signal. The open-loop amplitude calibration routine may be executed prior to activating the analog closed-loop voltage control of the oscillating frequency of VCO 30. For example, amplitude calibration unit 38 can calibrate the tail current source of VCO 30 so that the amplitude of the generated oscillating signal is acceptable. In this manner, closed-loop continuous control of the amplitude can be avoided to simplify VCO 30 during normal operation and possibly reduce system noise.

The tail current source of VCO 30 may be configurable so that amplitude calibration can be performed by discrete adjustments to the tail current source. For example, the tail current source of VCO 30 may include a number of switched unit current sources. Amplitude calibration unit 38 may selectively activate a number of the switched unit current sources within the tail current source of VCO 30 in order to properly calibrate the amplitude of the oscillating signal generated by VCO 30 to an acceptable amplitude. Once the amplitude is calibrated, the frequency of the oscillating signal of VCO 30 may be controlled via PLL 31. In that case, the amplitude of the oscillating signal may be fixed by the amplitude calibration routine. In other words, closed-loop continuous amplitude control can be avoided in order to eliminate noise generated by such closed loop amplitude control.

Frequency synthesizer 20 may include an amplitude calibration switch 41 for placing frequency synthesizer 20 in either an amplitude calibration state or a normal operation state. For example, during amplitude calibration, switch 41 can select "calibration reference voltage" 42 as input to oscillator 30 instead of a voltage provided by PLL 31. In other words, PLL 31 can be disabled during the amplitude calibration routine. When calibration reference voltage 42 is selected as input, amplitude calibration unit 38 can also be enabled. Calibration reference voltage 42 may be provided by an operational amplifier (op amp) and can be chosen to correspond to the center of the available input voltages that charge pump 35 can provide. Calibration reference voltage 42 may be tested or checked during calibration in order to ensure that it falls within range of voltages that charge pump 35 can provide.

Additionally, in some cases, calibration reference voltage 42 can be skewed in order to compensate for ambient conditions such as temperature. For example, if the ambient temperature is less than the normal operating temperature, it may be desirable to skew calibration reference voltage 42 to the lower end of the range of voltages that charge pump 35 can provide. Similarly, if ambient temperature is greater than the normal operating temperature, it may be desirable to skew calibration reference voltage 42 to the upper end of the range of voltages that charge pump 35 can provide. For example, temperature compensation circuitry which generates voltages proportional to absolute temperature (PTAT) may be implemented to generate calibration reference voltage 42. In any case, calibration reference voltage 42 causes VCO 30 to generate an initial oscillating signal having an initial frequency and an initial amplitude.

In accordance with one embodiment, amplitude calibration unit 38 detects the initial amplitude of the generated oscillating signal. In particular, amplitude calibration unit 38 may include a rectifier that generates a DC voltage representative of the amplitude of the oscillating voltage (AC voltage), as well as a comparator that compares the generated DC voltage to a target value. For example, the target value may comprise an optimal voltage amplitude for a given setting of the tail current source. In one example, the optimal voltage amplitude for a given setting may be determined by prior simulations and programmed into calibration unit 38. Also, as outlined in greater detail below, the optimal voltage amplitude may be selected based on a mode of operation of the wireless communication device implementing frequency synthesizer 20.

After comparing the detected voltage amplitude with the target, amplitude calibration unit 38 can then adjust the tail current source of VCO 30 in order to adjust the amplitude of the oscillating signal. For example, if the amplitude of the generated DC voltage is larger than the reference, unit current sources can be removed from the total current source to reduce the amplitude. Similarly, if the amplitude of the generated DC voltage is smaller than the reference, unit current sources can be added to the total current source to increase the signal amplitude. In one implementation described in greater detail below, the current source can be set to a maximum current setting and then reduced in discrete steps until the amplitude of the oscillating signal would fall below a target amplitude. In this manner, the configurable tail current source can be discretely adjusted so that VCO generates signals having the desired amplitude.

Once VCO 30 has been calibrated, switch 41 can enable PLL 31 to allow closed-loop analog control of the operating frequency of VCO 30. Closed-loop control of the oscillating signal amplitude, however, may be avoided in order to reduce system noise. In other words, in most cases, closed-loop control of the amplitude is not necessary after the configurable tail current source of VCO 30 has been properly calibrated. Nevertheless, in some cases where calibration may not occur for long, extended periods of time, it may still be desirable to provide closed-loop control of the amplitude at some point following discrete calibration of the amplitude, albeit at the expense of increased noise.

Figure 4:
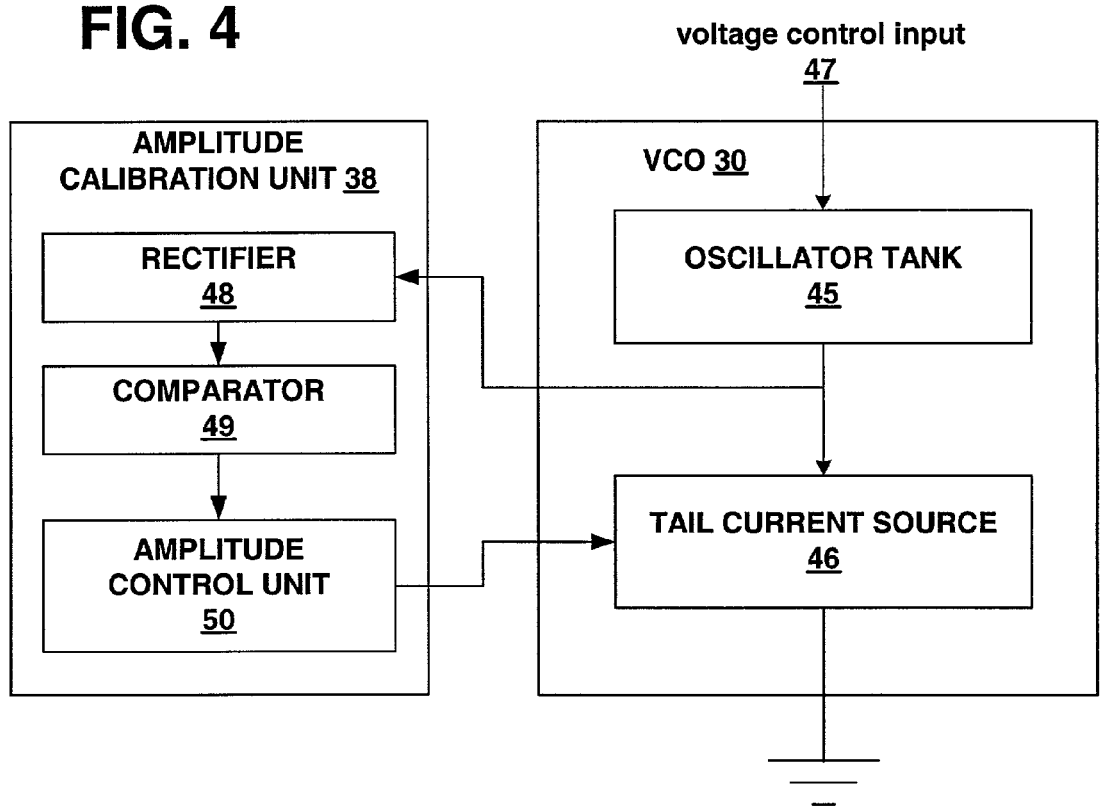
FIG. 4 is another block diagram illustrating an amplitude calibration unit coupled to a voltage controlled oscillator.

FIG. 4 is a more detailed block diagram of one embodiment of the components of frequency synthesizer 20 that can be implemented during amplitude calibration. As illustrated, VCO 30 includes an oscillator tank 45 coupled to a configurable tail current source 46. Oscillator tank 45 generates an oscillating voltage signal at a frequency defined by voltage control input 47. During calibration, voltage control input 47 corresponds to calibration reference voltage 42 (FIG. 3).

Amplitude calibration unit 38 may include a rectifier 48, a comparator 49, and an amplitude control unit 50. Rectifier 48 generates a DC voltage representative of the amplitude of the oscillating voltage generated by oscillator tank 45. Then, comparator 49 compares the generated DC voltage to a target value. Again, the target value may comprise an optimal voltage amplitude for a given setting of tail current source 46, such as a voltage amplitude determined by prior simulations. Additionally, in some cases, the optimal voltage amplitude may be selected based on a mode of operation of the wireless communication device implementing frequency synthesizer 20.

After comparator 49 compares the detected voltage amplitude with the target, amplitude control unit 50 adjusts the tail current source 46 of VCO 30 in order to adjust the amplitude. For example, amplitude control unit 50 may comprise a digital state machine that can selectively activate switches within configurable tail current source 46 to adjust the amplitude of the oscillating signal generated by VCO 30.

Figure 5:
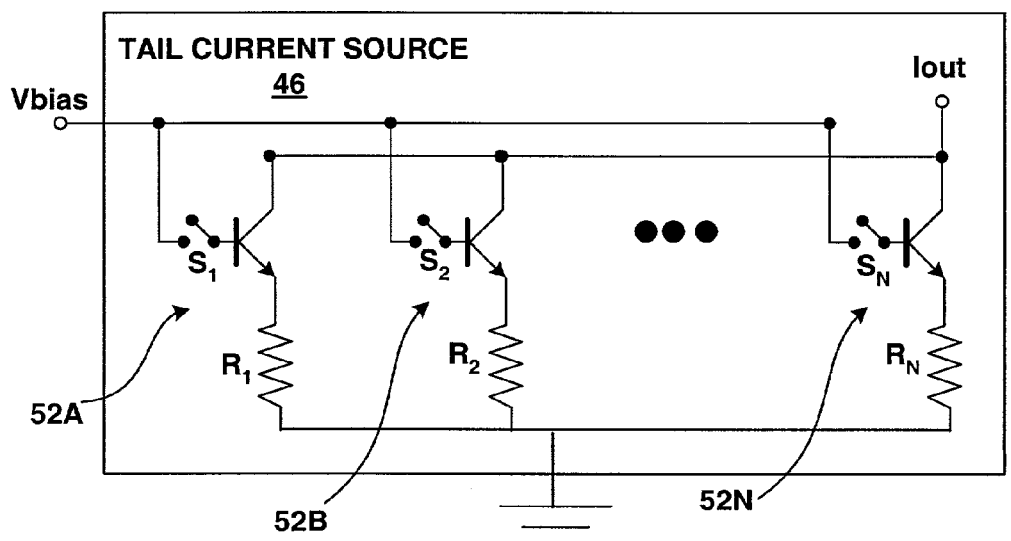
FIG. 5 is a more detailed block diagram of a tail current source of a voltage controlled oscillator.

FIG. 5 is a more detailed example of one configuration of configurable tail current source 46. In this case, configurable tail current source 46 comprises a number (N) of switched unit current sources in parallel. Each unit current source (52A, 52B, . . . 52N) includes an activation switch (S) controlled by amplitude control unit 50. In other words, amplitude control unit 50 may selectively activate switches (S) within configurable tail current source 46 to adjust the amplitude of the oscillating signal. Each unit current source 52 may generate the same amount of current or a different amount of current than the other unit current sources.

In one particular implementation, amplitude control unit 50 initially sets configurable tail current source 46 of VCO 30 to a maximum current setting. In the maximum current setting, all of the switches (S) would be activated. Amplitude control unit 50 may then reduce the current setting of the configurable tail current source in discrete steps, such as by de-activating the switched current sources 52 in discrete steps until the amplitude of the oscillating signal would fall below a target amplitude. In some cases, amplitude control unit 50 measures the effect of deactivating switches, and in other cases, amplitude control unit 50 simply calculates the effect of the deactivation of switches in order to determine a subset of switches to activate or deactivate.

Performing amplitude calibration via the open-loop techniques described herein can improve the operation of frequency synthesizer 20 by avoiding noise conventionally associated with continuous closed-loop control. Still, open-loop discrete calibration can achieve acceptable amplitude control to avoid start-up problems associated with insufficient bias, and noise associated with either insufficient or excessive amplitude.

Depending on the implementation of frequency synthesizer 20 and the sensitivity of the discrete amplitude calibration, however, the calibration routine may need to be performed periodically in order to ensure that the amplitude remains near an optimal amplitude and does not add unnecessary noise. Accordingly, it may be desirable to perform amplitude calibration during a period of time when PLL 31 is disabled for one or more other reasons unrelated to amplitude calibration. Hence, if amplitude calibration is performed when PLL 31 is disabled for another reason, the amplitude calibration routine may not add any additional down-time to PLL 31.

Co-pending and commonly assigned U.S. patent application Ser. No. 10/092,669, entitled CALIBRATION TECHNIQUES FOR FREQUENCY SYNTHESIZERS, filed on Mar. 6, 2002 for Jeremy D. Dunworth et. al, describes frequency calibration techniques for a frequency synthesizer and is hereby incorporated herein by reference in its entirety. In embodiments described in the above-identified application, the PLL of an oscillator may be disabled for frequency calibration. Accordingly, the amplitude calibration techniques described herein may be performed in parallel with frequency calibration techniques, such as those described in the above-identified application in order to avoid any additional down-time to PLL 31 during amplitude calibration. Also, by performing amplitude calibration techniques in parallel with frequency calibration techniques, the amplitude calibration routine may be modified to account for any adjustments to resistance in the oscillator tank of the VCO (which may affect amplitude), such as changes in resistance that result from the activation or deactivation of capacitor switches.

Briefly, the frequency synthesizer described in the above-identified application comprises an oscillator and a frequency calibration unit used to calibrate a frequency of the oscillator. The oscillator includes configurable circuitry that can be selectively activated to adjust the frequency of the oscillator for a given input voltage. For example, the configurable circuitry may comprise a set of switched capacitors within the oscillator tank of the oscillator. The frequency calibration unit of the frequency synthesizer may selectively activate the configurable circuitry of the VCO based on a comparison of a signal indicative of the oscillating frequency of the VCO and a signal indicative of a reference frequency. More specifically, the calibration unit may initialize dividers that provide the signals indicative of the VCO frequency and the reference frequency at approximately the same time, so that the frequencies of the generated signals are substantially in phase at the start of calibration. In this manner, the frequency synthesizer can be quickly calibrated, ensuring that an analog gain of the frequency synthesizer is adequate to tune the VCO.

Figure 6:
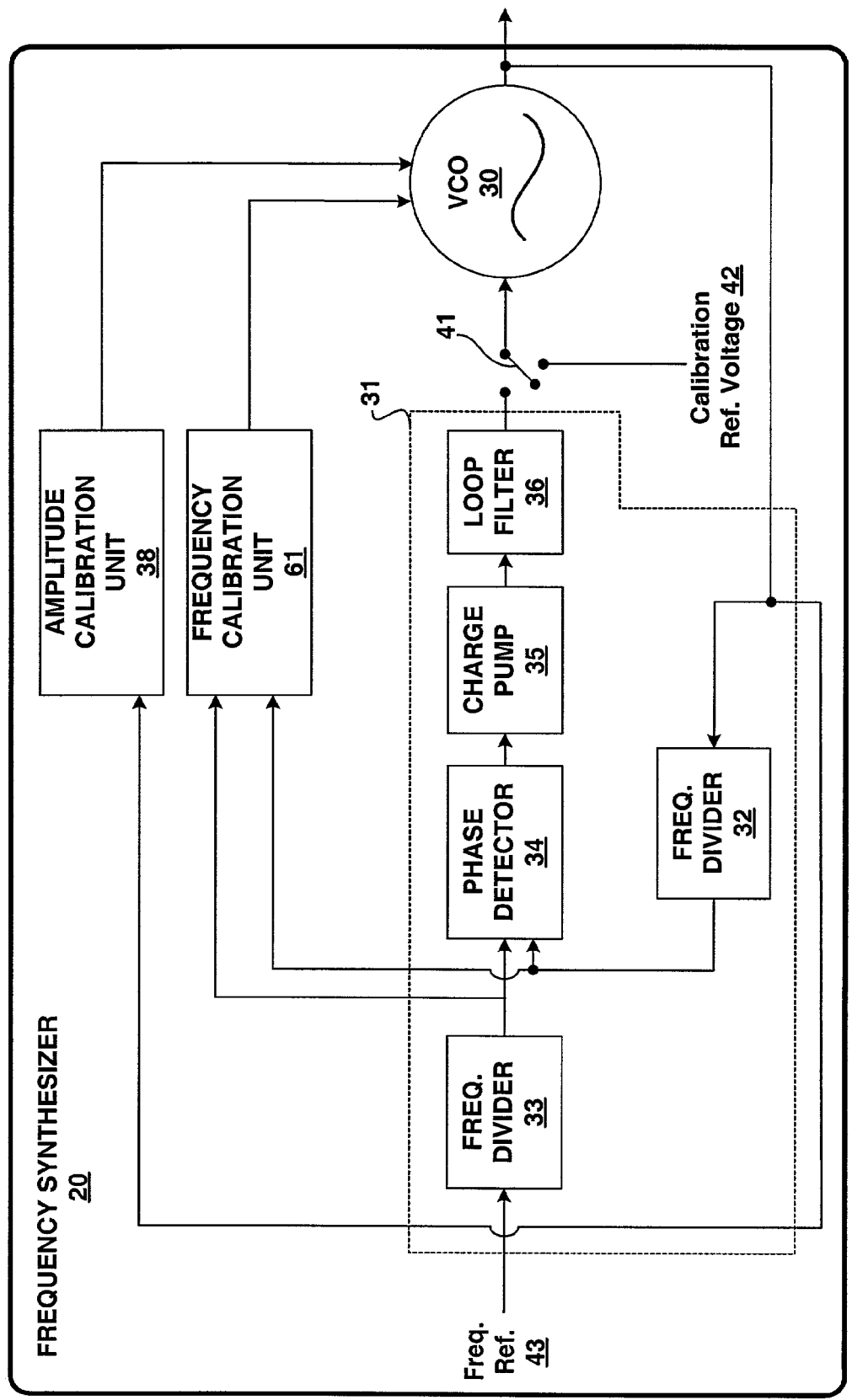
FIG. 6 is a detailed block diagram of an exemplary frequency synthesizer implementing discrete amplitude calibration and discrete frequency calibration techniques.

FIG. 6 is a block diagram of a frequency synthesizer 20 implementing discrete frequency calibration of VCO 30 and discrete amplitude calibration of VCO 30 in parallel. In this example, VCO 30 includes a configurable tail current source as outlined above. In addition, VCO 30 may include additional configurable circuitry so that frequency calibration can be performed at the same time as amplitude calibration. For example, VCO 30 may include a number of switched capacitors that facilitate adjustments to the capacitance of the oscillator tank of VCO 30. In general, one or more of a variety of different frequency calibration techniques may be implemented when PLL is disabled. In the example of FIG. 6, however, the frequency calibration technique used is one described in the U.S. patent application Ser. No. 10/092,669 mentioned above.

As shown in FIG. 6, frequency synthesizer 20 includes a calibration switch 41 for placing frequency synthesizer 20 in either a calibration state or a normal operation state. When calibration reference voltage 42 is selected, frequency synthesizer 20 implements open-loop amplitude calibration techniques using amplitude calibration unit 38 as outlined above. At the same time, frequency synthesizer 20 may implement frequency calibration techniques. Indeed, the fact that frequency calibration is implemented may cause the PLL 31 to be disabled, thus defining a window of time when amplitude calibration can be performed without adding additional down time to PLL 31.

In particular, to perform frequency calibration of VCO 30, first frequency divider 32 scales the oscillator frequency, such as by dividing the frequency by an integer. Similarly, second frequency divider 33 scales a reference frequency 43, such as by dividing the reference frequency by an integer. The reference frequency 43, may be provided, for example, by a higher accuracy, lower frequency clock than VCO 30, such as a temperature compensated crystal oscillator (TCXO). The outputs of the frequency dividers 32, 33, respectively, comprise a signal indicative of the oscillator frequency (in this case, the frequency of VCO 30), and a signal indicative of the reference frequency 43. The output signals of frequency dividers 32, 33 are scaled so that a measure of the phase difference between the signals can provide a measure of the error in VCO 30.

Dividers 32 and 33 may be implemented using a wide variety of different hardware configurations, including multiplier circuits, divider circuits, shift registers, counters, and the like. In one configuration, dividers 32, 33 include counters that count the leading or trailing edges of oscillator pulses, and provide a signal each time an integer number of pulses is detected. In this manner, signals indicative of the frequency of VCO 30 and the reference frequency 43 can be generated and provided to frequency calibration unit 61, which can use the signals to calibrate the frequency of VCO 30.

As described in the above-identified application, in order to greatly improve the frequency calibration process, frequency calibration unit 61 initializes dividers 32, 33 at approximately the same time. In this manner, signals indicative of the frequency of VCO 30 and the reference frequency 43 are scaled at approximately the same time. In other words, by initializing dividers 32, 33 at approximately the same time, the signals generated by dividers 32, 33 are substantially in phase. Therefore, frequency calibration unit 61 can determine a frequency difference between the signals generated by dividers 32, 33 after only one signal cycle. In this manner, frequency calibration unit 61 can avoid the need to accumulate or track the generated signals for extended periods of time. Instead, by initializing dividers 32, 33 at approximately the same time, frequency calibration unit 61 can determine the phase difference between the signals and adjust VCO 30 more quickly. In other words, initializing dividers 32, 33 at approximately the same time can significantly reduce the time it takes to calibrate VCO 30.

As mentioned, when frequency calibration and amplitude calibration of VCO 30 are performed in parallel, additional down time of PLL 31 associated with the amplitude calibration can be avoided. Nevertheless, it is understood that this stated advantage can be more generally achieved by performing the amplitude calibration techniques any time PLL 31 is disabled for any additional reason. In other words, frequency calibration is only one example where PLL 31 is already disabled for a reason unrelated to amplitude calibration.

Figure 7:
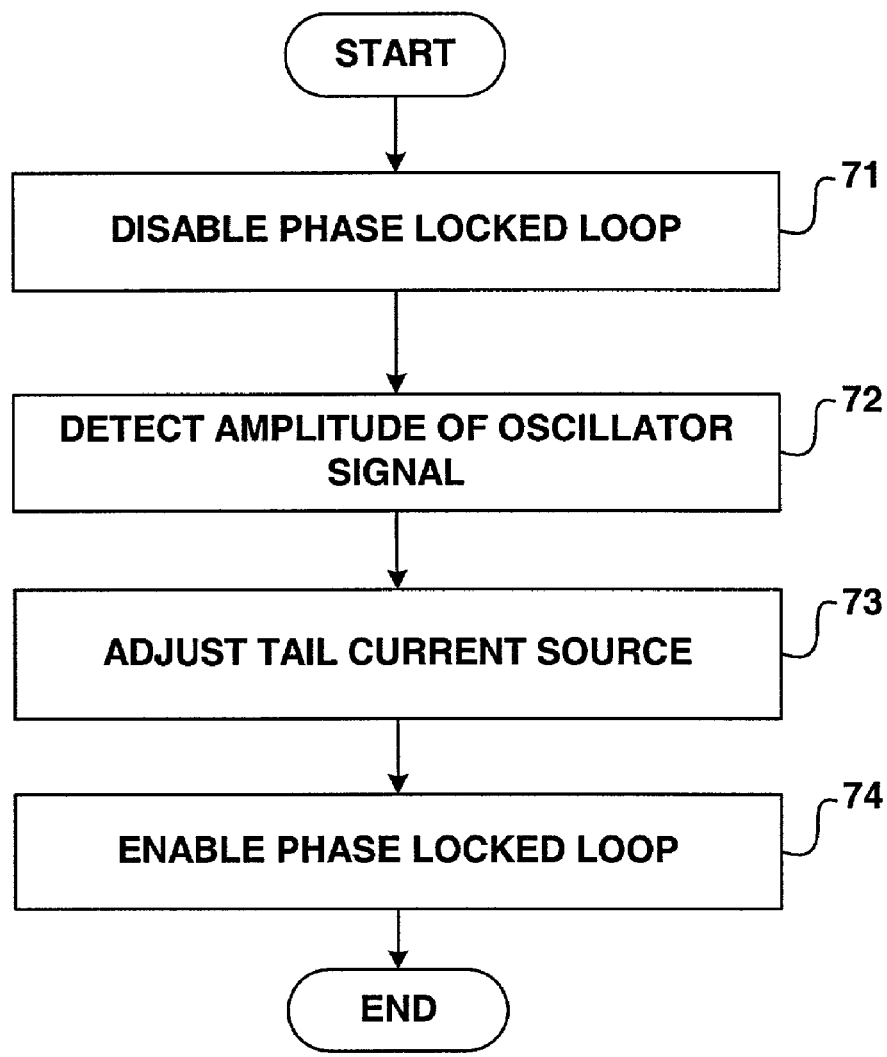
FIGS. 7–10 are flow diagrams illustrating operation of a frequency synthesizer.

FIG. 7 is a flow diagram illustrating an amplitude calibration technique according to an embodiment. As shown, frequency synthesizer 20 disables the phase locked loop (PLL) 31 (71), such as by activating switch 41 to select calibration input voltage 42 as input to VCO 30. Amplitude calibration unit 38 detects the amplitude of the oscillator signal (72) such as by generating a DC voltage based on an oscillating voltage taken from VCO 30, and comparing the generated DC voltage to a target. Amplitude calibration unit 38 then adjusts tail current source 46 of VCO 30 in order to adjust the amplitude (73). Once the amplitude is calibrated, frequency synthesizer 20 enables PLL 31 to provide closed-loop voltage control of the frequency of VCO 30 (74).

Figure 8:
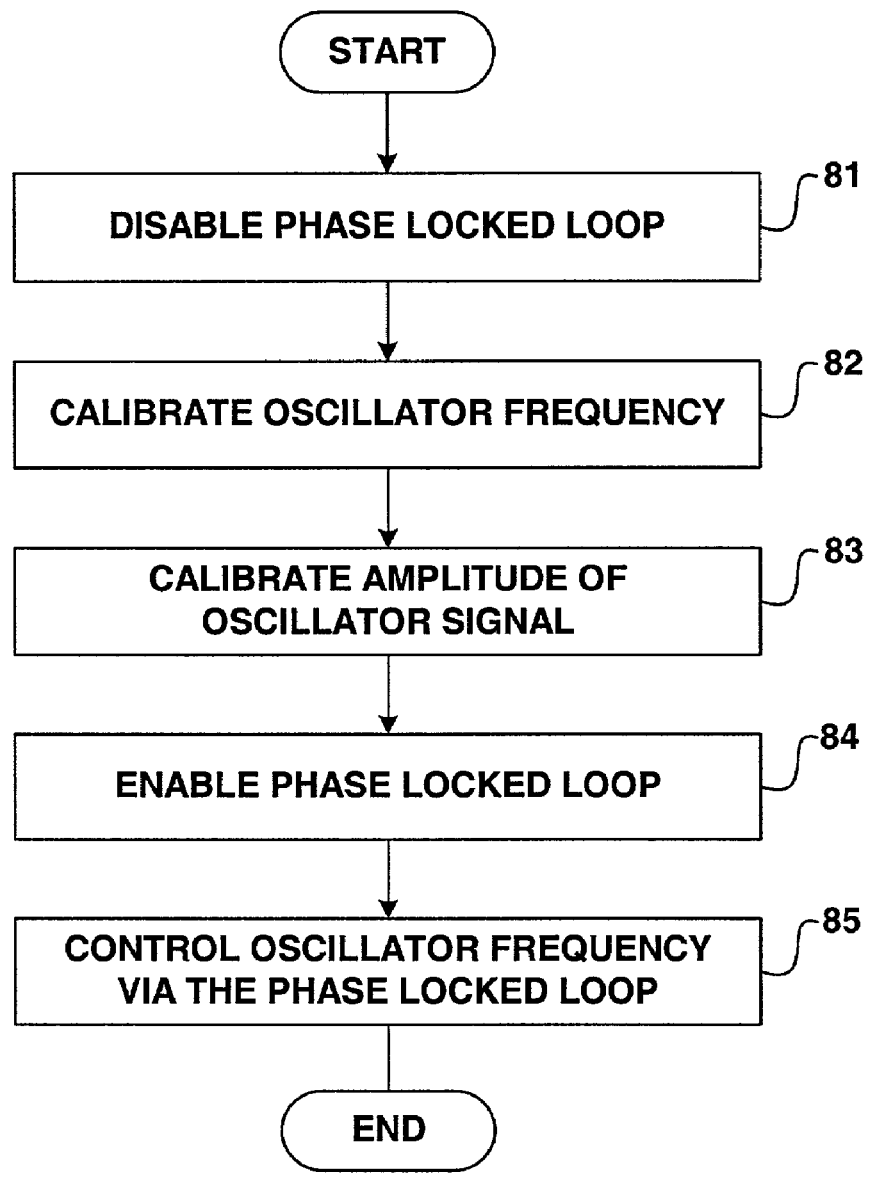

FIG. 8 is another flow diagram illustrating a calibration technique that involves both discrete amplitude calibration of VCO 30 and discrete frequency calibration of VCO 30. As shown, frequency synthesizer 20 disables PLL 31 (81), such as by activating switch 41 to select calibration input voltage 42 as input to VCO 30. Frequency calibration unit 61 calibrates the oscillator frequency (82), such as by selectively activating a subset of switched capacitors within the oscillator tank of VCO 30. At substantially the same time, amplitude calibration unit 38 calibrates the amplitude of the oscillating signal (83), such as by selectively activating a subset of switched unit current sources within the total tail current source of VCO 30. Once both the amplitude and frequency have been calibrated, frequency synthesizer 20 enables PLL 31 (84) and controls the oscillator frequency via PLL 31 (85).

Figure 9:
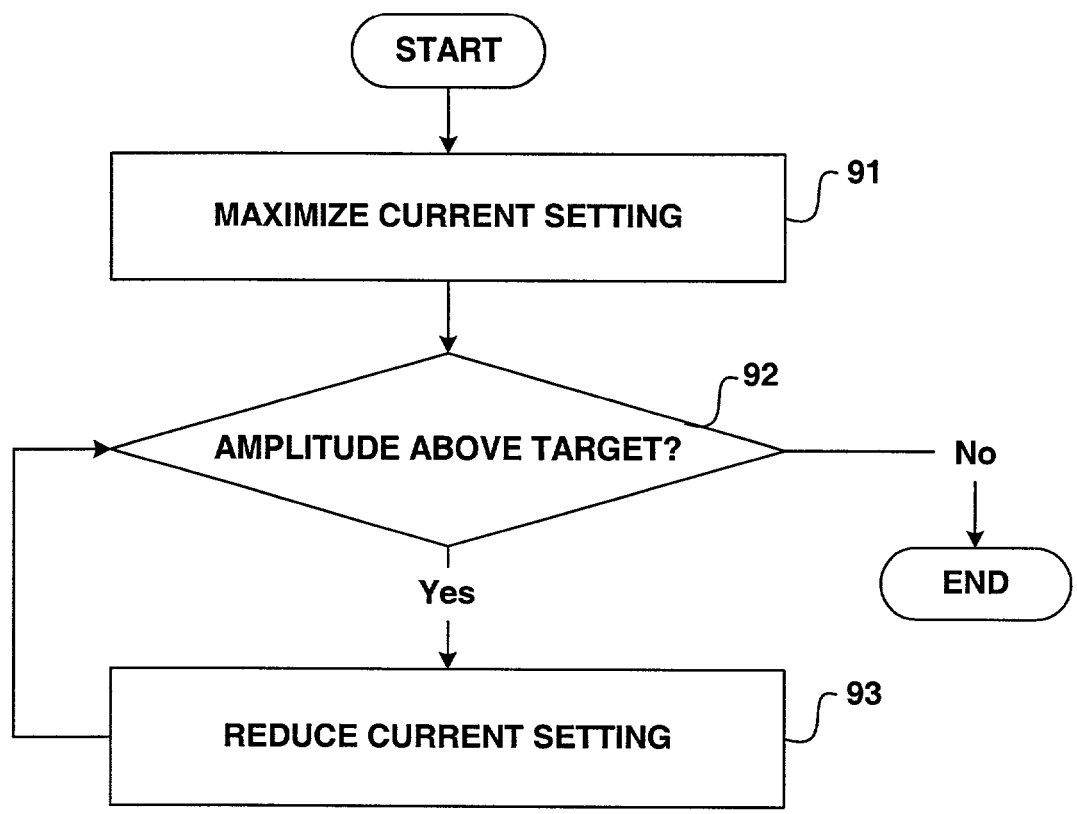

FIG. 9 is another flow diagram illustrating one implementation of amplitude calibration. As shown, amplitude calibration unit 38 maximizes the current setting associated with tail current source 46 (91). Amplitude calibration unit 38 then compares amplitude of the oscillating signal associated with the current setting to a target value (92). Amplitude calibration unit 38 then incrementally reduces the current setting (93) until the amplitude of the oscillating signal associated with the current setting is below the target. For example, amplitude calibration unit 38 may incrementally deactivate switched unit current sources until the amplitude would be below the target. In some cases, amplitude calibration unit 38 takes measurements after deactivating switches, and in other cases, amplitude calibration unit 38 simply calculates the effect of the deactivation of switches in order to determine a subset of switches to activate or deactivate.

In other implementations, amplitude control unit 38 may simply select the desired current setting and then activate or deactivate a subset of switched unit current sources within tail current source 46. In still other implementations, amplitude control unit 38 may incrementally activate switched unit current sources to increase the amplitude of the oscillating signal until it is at or near the target. Starting with the maximum current setting and reducing current, however, may be more advantageous because it may better ensure that VCO 30 is always able to effectively start-up.

Figure 10:
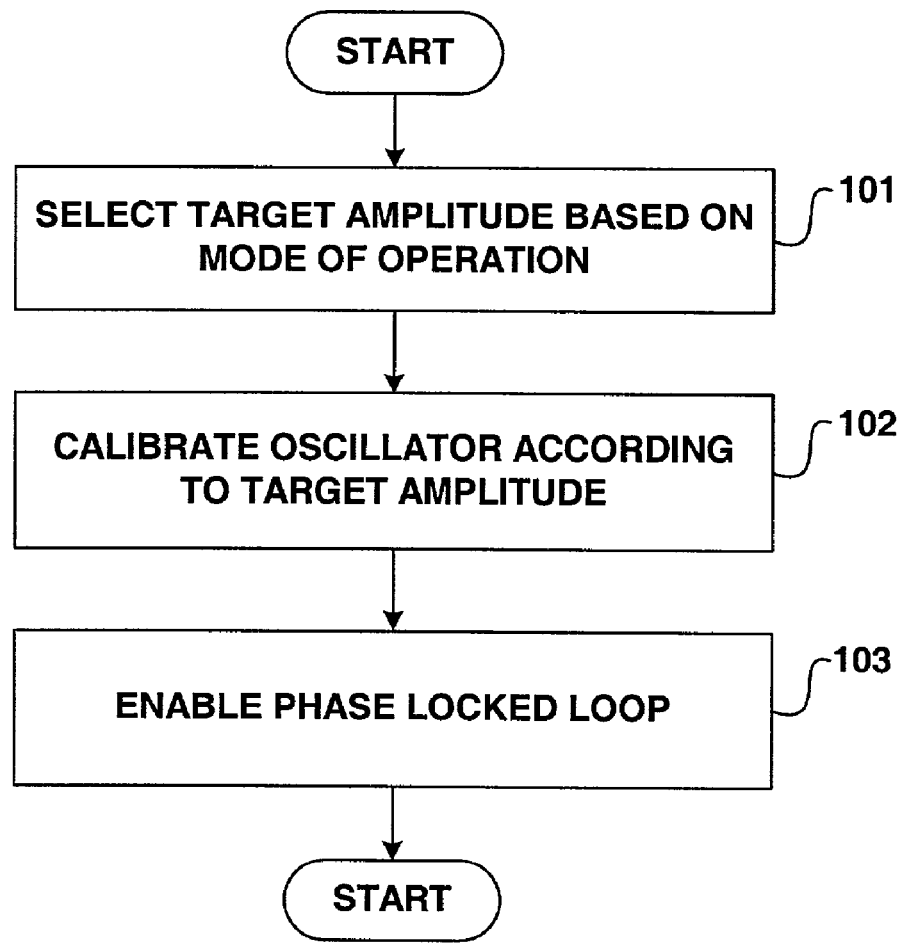

FIG. 10 is another flow diagram illustrating an additional technique that can be used during amplitude calibration of an oscillator implemented within a wireless communication device (WCD). As shown, WCD 10 selects a target amplitude for VCO 30 based on a mode of operation (101). For example, WCD 10 may periodically operate in one or more of a variety of different modes, and each mode may require more or less amplitude from the oscillating signal. As one example, the amplitude required for a CDMA transmit mode may be less than the amplitude required for GSM receive mode. For this reason, the performance of WCD 10 can be improved by selecting the target amplitude based on the mode of operation of WCD 10 (101). Amplitude calibration unit 38 can then calibrate VCO 30 using the target amplitude as a reference (102). Frequency synthesizer 20 can then enable PLL 31 for normal operation (103).

In different embodiments, the target amplitude may be selected as a current amplitude or a voltage amplitude. If the target amplitude is a current amplitude, then amplitude calibration unit 38 would compare the target to the current generated by the configurable tail current source 46 for a given setting of switched unit current sources (or to a calculated current expected from the configurable tail current source 46 for a given setting of switched current sources). If the target is a voltage amplitude, then amplitude calibration unit 38 may compare the target to the DC voltage generated by rectifier 48. In that later case, amplitude calibration unit 38 would still adjust the configurable tail current source 46, but would do so based on difference between the DC voltage generated by the rectifier and the target voltage. In short, it is understood that the relationship between voltage, resistance and current (V=IR) can be exploited to set the target in either a voltage or a current. In either case, an adjustment to the magnitude of the configurable tail current source 46 can be made to ensure that the signal generated by the oscillator is acceptable.

For example, $V_O$ (the voltage amplitude of oscillation) is proportional to $I_{TC}$ (the DC value of the tail current source). During modeling, $R_P$ (the effective tank parallel resistance) is effectively unknown, but can be characterized. Because of variation in components fabricated on-chip, however, $I_{TC}$ may need to be calibrated. To do so, a good voltage reference with small variation over process and temperature can be developed, e.g. a ubiquitous bandgap voltage reference. $V_O$ can then be rectified and compared to a reference, and $I_{TC}$ can be adjusted to give the desired amplitude. This can also take care of any variation or uncertainty in $R_P$.

A number of embodiments have been described. For example, amplitude calibration techniques have been described for discretely calibrating the amplitude of an oscillator signal prior to activating a phase locked loop. Nevertheless various modifications can be made without departing from the scope of this disclosure. For example, the same or similar techniques may be implemented in devices other that a wireless communication device. Also, the same or similar techniques may be used with oscillators other than voltage controlled oscillators. For example, similar techniques may be may be used to calibrate current controlled oscillators, and the like.

Furthermore, although many detailed aspects of the various embodiments have been described as being implemented in hardware, the same or similar techniques may be implemented in software, firmware, or various combinations of hardware, software and firmware. Accordingly, these and other embodiments are within the scope of the following claims.

The invention claimed is:

1. A frequency synthesizer comprising:
   a voltage controlled oscillator including a configurable tail current source having a number of switched unit current sources;
   a phase locked loop to control a frequency of an oscillating signal of the voltage controlled oscillator; and
   an amplitude calibration unit to calibrate the configurable tail current source when the phase locked loop is disabled to achieve a desired amplitude for the oscillating signal,
   the amplitude calibration unit detecting a voltage amplitude of the oscillating signal and adjusting the configurable tail current source to achieve the desired amplitude for the oscillating signal,
   wherein the adjusting comprises selecting switched unit current sources in discrete steps until the voltage amplitude falls below a target, the target being variably selectable on the basis of a current mode of operation.

2. The frequency synthesizer of claim 1, wherein the voltage controlled oscillator includes additional configurable circuitry that affects the frequency of the voltage controlled oscillator, the frequency synthesizer further comprising:
   a frequency calibration unit to adjust the additional configurable circuitry of the voltage controlled oscillator so as to calibrate the frequency of the oscillator while the phase locked loop is disabled.

3. The frequency synthesizer of claim 1, wherein the current mode of operation is selected from among at least two modes associated with different amplitudes for the oscillating signal.

4. The frequency synthesizer of claim 3, wherein the at least two modes comprise a transmit mode and a receive mode.

5. The frequency synthesizer of claim 3, wherein the at least two modes are for at least two different wireless communication systems.

6. The frequency synthesizer of claim 3, wherein the target is determined based on a band gap voltage reference.

7. The frequency synthesizer of claim 1, wherein the additional configurable circuitry of the voltage controlled oscillator comprises a plurality of switched capacitors, and wherein the frequency calibration unit selectively activates the plurality of switched capacitors to calibrate the frequency of the oscillator.

8. An RF integrated circuit adapted for coupling to an external voltage controlled oscillator, the RF integrated circuit comprising:
   a configurable tail current source having a number of switched unit current sources;
   a phase locked loop to control a frequency of an oscillating signal of the voltage controlled oscillator; and
   an amplitude calibration unit to calibrate the configurable tail current source when the phase locked loop is disabled to achieve a desired amplitude for the oscillating signal,
   the amplitude calibration unit detecting a voltage amplitude of the oscillating signal and adjusting the configurable tail current source to achieve the desired amplitude for the oscillating signal.
   wherein the adjusting comprises selecting switched unit current sources in discrete steps until the voltage amplitude falls below a target, the target being variably selectable on the basis of a current mode of operation.

9. The RF integrated circuit of claim 8, further comprising:
   additional configurable circuitry to adjust the frequency of the voltage controlled oscillator; and
   a frequency calibration unit to adjust the additional configurable circuitry of the voltage controlled oscillator so as to calibrate the frequency of the oscillator while the phase locked loop is disabled.

10. An RF integrated circuit adapted for coupling to an external voltage controlled oscillator including a configurable tail current source having a number of switched unit current sources, the RF integrated circuit comprising:
    a phase locked loop to control a frequency of an oscillating signal of the voltage controlled oscillator; and
    an amplitude calibration unit to calibrate the configurable tail current source when the phase locked loop is disabled to achieve a desired amplitude for the oscillating signal,
    the amplitude calibration unit detecting a voltage amplitude of the oscillating signal and adjusting the configurable tail current source to achieve the desired amplitude for the oscillating signal,
    wherein the adjusting comprises selecting switched unit current sources in discrete steps until the voltage amplitude falls below a target, the target being variably selectable on the basis of a current mode of operation.

11. The RF integrated circuit of claim 10, further comprising:
    additional configurable circuitry to adjust the frequency of the voltage controlled oscillator; and
    a frequency calibration unit to adjust the additional configurable circuitry of the voltage controlled oscillator so as to calibrate the frequency of the oscillator while the phase locked loop is disabled.

* * * * *